(12) United States Patent
Zhang et al.

(10) Patent No.: US 9,412,603 B2
(45) Date of Patent: Aug. 9, 2016

(54) TRIMMING SILICON FIN WIDTH THROUGH OXIDATION AND ETCH

(71) Applicant: Applied Materials, Inc., Santa Clara, CA (US)

(72) Inventors: Ying Zhang, Santa Clara, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/548,044

(22) Filed: Nov. 19, 2014

(65) Prior Publication Data

US 2015/0140787 A1 May 21, 2015

Related U.S. Application Data

(60) Provisional application No. 61/906,623, filed on Nov. 20, 2013, provisional application No. 61/906,249, filed on Nov. 19, 2013.

(51) Int. Cl.
*H01L 29/78* (2006.01)
*H01L 21/306* (2006.01)
*H01L 21/3065* (2006.01)
*H01L 21/308* (2006.01)
*H01L 21/02* (2006.01)
*H01L 21/311* (2006.01)

(52) U.S. Cl.
CPC ...... *H01L 21/30604* (2013.01); *H01L 21/3065* (2013.01); *H01L 21/3081* (2013.01); *H01L 21/02126* (2013.01); *H01L 21/02236* (2013.01); *H01L 21/02252* (2013.01); *H01L 21/02255* (2013.01); *H01L 21/02271* (2013.01); *H01L 21/31116* (2013.01); *H01L 21/31138* (2013.01)

(58) Field of Classification Search
CPC .................. H01L 21/30604; H01L 21/02587; H01L 21/3065; H01L 29/785; H01L 21/823821; H01L 29/66795; H01L 27/0924
USPC .......... 438/243, 792, 770, 283; 257/347, 350, 257/E21.409
See application file for complete search history.

(56) References Cited

U.S. PATENT DOCUMENTS

| 6,855,582 | B1 | 2/2005 | Dakshina-Murthy et al. |
| 6,864,164 | B1 | 3/2005 | Dakshina-Murthy et al. |
| 7,470,570 | B2 | 12/2008 | Beintner et al. |
| 7,772,048 | B2 | 8/2010 | Jones et al. |
| 8,716,156 | B1* | 5/2014 | Pawlak ........... H01L 21/823821 438/770 |
| 2001/0031559 | A1* | 10/2001 | Koido ............... H01L 27/11521 438/703 |
| 2005/0121412 | A1 | 6/2005 | Beintner et al. |
| 2005/0153466 | A1* | 7/2005 | Choi ........................ G03F 1/14 438/14 |

(Continued)

*Primary Examiner* — Yasser A Abdelaziez
*Assistant Examiner* — Omar Mojaddedi
(74) *Attorney, Agent, or Firm* — Patterson & Sheridan, LLP (57) ABSTRACT

Embodiments described herein generally relate to methods of forming sub-10 nm node FinFETs. Various processing steps are performed on a substrate to provide a trench defining a mandrel structure. Sidewalls of the mandrel structure and a bottom surface of the trench are oxidized and subsequently etched to reduce a width of the mandrel structure. The oxidation and etching of the mandrel structure may be repeated until a desired width of the mandrel structure is achieved. A semiconducting material is subsequently deposited on a regrowth region of the mandrel structure to form a fin structure. The oxidizing and etching the mandrel structure provides a method for forming the fin structure which can achieve sub-10 nm node dimensions and provide increasingly smaller FinFETs.

19 Claims, 9 Drawing Sheets

(56) References Cited

U.S. PATENT DOCUMENTS

| | | | |
|---|---|---|---|
| 2012/0228702 A1* | 9/2012 | Wu | H01L 29/4236 257/330 |
| 2012/0295444 A1* | 11/2012 | Godet | H01L 21/02321 438/694 |
| 2012/0313170 A1 | 12/2012 | Chang et al. | |
| 2013/0230953 A1* | 9/2013 | Sudo | H01L 29/785 438/268 |
| 2014/0291693 A1* | 10/2014 | Then | H01L 29/802 257/76 |
| 2015/0008484 A1* | 1/2015 | Cea | H01L 29/66545 257/192 |
| 2015/0091099 A1* | 4/2015 | Ching | H01L 21/823431 257/401 |
| 2015/0126008 A1* | 5/2015 | Paul | H01L 21/823431 438/283 |
| 2015/0303274 A1* | 10/2015 | Zhu | H01L 29/6681 438/283 |

* cited by examiner

TRIMMING SILICON FIN WIDTH THROUGH OXIDATION AND ETCH

CROSS-REFERENCE TO RELATED APPLICATIONS

This application claims benefit to U.S. Provisional Patent Application Ser. No. 61/906,249, filed Nov. 19, 2013, and U.S. Provisional Patent Application Ser. No. 61/906,623, filed Nov. 20, 2013, both of which are incorporated herein by reference in their entirety.

BACKGROUND

1. Field

Embodiments described herein generally relate to processes for forming silicon fins in a FinFET structure. More specifically, embodiments described herein relate to trimming silicon fin width through oxidation and etch.

2. Description of the Related Art

In response to an increased need for smaller electronic devices with denser circuits, devices with three dimensional (3D) structures have been developed. An example of such devices may include FinFETs having conductive fin-like structures that are raised vertically above a horizontally extending substrate. Conventional FinFETs may be formed on a substrate, such as a semiconducting substrate or silicon-on-insulator. The substrate may comprise a semiconducting substrate and an oxide layer disposed on the semiconducting substrate.

When manufacturing FinFETs, it is desirable to have a fin structure with a high aspect ratio. A higher aspect ratio for the fin structure allows a larger amount of current to be provided through the same amount of topographical area. Fabrication of high aspect ratio FinFETs is difficult as a result of the reduced critical dimensions required for sub-10 nm nodes. The reduced critical dimensions create challenges in forming trenches, fins and other features which are required to form FinFETs.

Thus, there is a need in the art for improved methods of forming sub-10 nm node FinFETs.

SUMMARY

In one embodiment, a method of forming a fin structure on a substrate is provided. The method comprises etching a silicon layer to form a trench defining a mandrel structure and oxidizing sidewalls of the mandrel structure and a bottom surface of the trench to form an oxidized surface. The oxidized surface is etched to reduce a width of the mandrel structure and an insulator material is deposited over the silicon layer. The mandrel structure is then etched and a semiconducting material is formed on the mandrel structure. Finally, a portion of the insulator material and the semiconducting material are planarized.

In another embodiment, a method of forming a fin structure on a substrate is provided. The method comprises etching a silicon layer to form a trench defining a silicon mandrel structure and oxidizing sidewalls of the mandrel structure and a bottom surface of the trench to form an oxidized surface. The oxidized surface comprises silicon dioxide and has a thickness of between about 2 nm and about 5 nm. The silicon dioxide is etched to reduce a width of the silicon mandrel structure to between about 5 nm and about 8 nm and an oxide material is deposited over the silicon layer. The silicon mandrel structure is then etched and a semiconducting material is formed on the silicon mandrel structure. Finally, a portion of the oxide material and the semiconducting material are planarized.

In yet another embodiment, a method of forming a fin structure on a substrate is provided. The method comprises depositing one or more photoresist materials and annealing the one or more photoresist materials to form a first region of a photoresist layer and a second region of a photoresist layer. The method further comprises etching a first region of a photoresist layer to expose a first region of a neutral layer, etching the exposed region of the neutral layer to expose a first region of a hardmask layer and etching the exposed region of the hardmask layer to expose a silicon layer. A second region of the photoresist layer and a second region of the neutral layer are etched to expose a second region of the hardmask layer. The silicon layer is then etched to form a trench defining a mandrel structure and sidewalls of the mandrel structure and a bottom surface of the trench are oxidized to form an oxidized surface. The oxidized surface is then etched to reduce a width of the mandrel structure, a second region of the hardmask layer is removed, an insulator material is deposited over the silicon layer and a top surface of the mandrel structure and the insulator material are planarized. Ions are then implanted into the mandrel structure and the insulator material and the mandrel structure is etched to a depth of the implanted ions to expose insulator features. A semiconducting material is then deposited on a regrowth region of the mandrel structure to form a fin structure, the fin structure being bounded by the insulator material, and a portion of the insulator material and the fin structure are removed to form a planar surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to methods of forming features for microelectronic devices. More specifically, embodiments described herein generally relate to methods of forming sub-10 nm node FinFETs. Various processing steps are performed on a substrate to provide a trench defining a mandrel structure. Sidewalls of the mandrel structure and a bottom surface of the trench are oxidized and subsequently etched to reduce a width of the mandrel structure. The oxidation and etching of the mandrel structure may be repeated until a desired width of the mandrel structure is achieved. A semiconducting material is subsequently deposited on a regrowth region of the mandrel structure to form a fin structure. Oxidizing and etching the mandrel structure provides a method for forming the fin structure which can achieve sub-10 nm node dimensions and provide increasingly smaller FinFETs.

Figure 1:
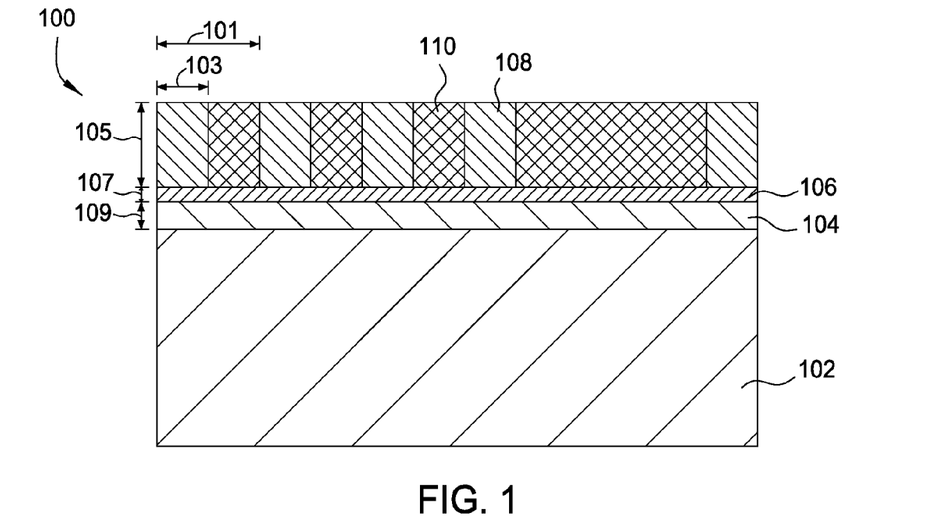
FIG. 1 illustrates a cross-sectional view of a substrate having various layers formed thereon.

FIG. 1 is a cross-sectional view of a substrate 100 having various layers formed thereon. The substrate 100 comprises a silicon layer 102, hardmask layer 104, neutral layer 106, and a photoresist layer 108, 110. The silicon layer 102 comprises a monocrystalline silicon material which is either an intrinsic (un-doped) silicon material or an extrinsic (doped) silicon material. If an extrinsic silicon material is utilized, the dopant may be a p-type dopant, such as boron. The hardmask layer 104 is disposed over the silicon layer 102. In one example, the hardmask layer 104 comprises a silicon nitride material, however, other hardmask layers which are capable of functioning as an etch stop may also be utilized. For example, depending upon pitch size and the lithography processes performed, more complex stack layers may be utilized as the hardmask layer 104. The hardmask layer 104 has a thickness 109 of between about 20 nm and about 40 nm, such as about 30 nm.

The neutral layer 106 is disposed over the hardmask layer 104 and may comprise an antireflective coating material such as silicon carbide. The neutral layer 106 has a thickness 107 of between about 2 nm and about 20 nm, such as about 8 nm.

The photoresist layer 108, 110 comprises one or more materials which are developed into distinct regions. In one example, the photoresist layer 108, 110 is a single material which is developed into two distinct regions. In this example, the photoresist layer 108, 110 comprises at least two different materials after performing a developing (annealing or the like) process. The first material 108 comprises polystyrene and the second material 110 comprises a polymer material. For example, the second material 110 may be polymethylmethacrylate (PMMA). In one embodiment, the first material 108 and the second material 110 are deposited by a spin-on coating process and separated into two different domains after the annealing process. The process of creating two different domains within the photoresist layer 108, 110 can proceed by directed self-assembly lithography. Both the first material 108 and the second material 110 have a thickness 105 of between about 30 nm and about 50 nm, such as about 40 nm, and a width 103 of between about 10 nm and about 30 nm, such as about 20 nm. Thus, a pitch 101, which is the combined width of the first material 108 and the second material 110, may be between about 20 nm and about 60 nm, such as about 40 nm. Although described as utilizing a directed self-assembly lithography process for forming the photoresist layer 108, 110, other processes such as 193 nm immersion lithography with self-aligned double photoresist, e-beam lithography, and extreme ultra-violet (EUV) lithography may also be utilized.

Figure 2:
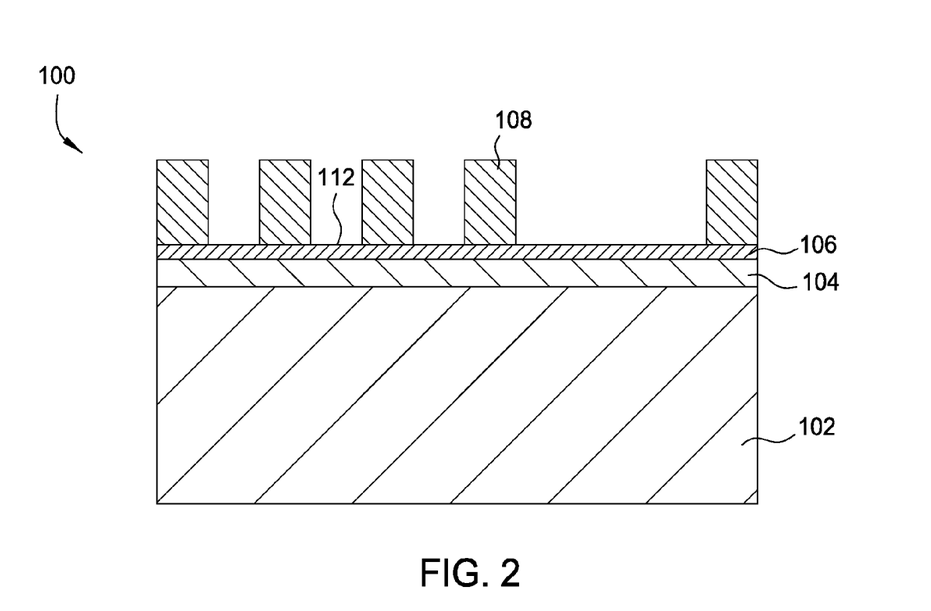
FIG. 2 is a cross-sectional view of the substrate illustrating the result of an etching process.

FIG. 2 is a cross-sectional view of the substrate 100 illustrating the result of an etching process. An etch process is performed on the substrate 100 to selectively remove the second material 110. Removing the second material 110 forms an exposed region 112 of the neutral layer 106. The etch process may be either a wet etch or a dry etch. For example, a wet etching process may proceed by exposing the second material 110 to UV radiation having a wavelength of about 254 nm at a power of about 18 W/cm² for about 35 minutes. The UV exposure causes the second material 110 to degrade and the first material to undergo a crosslinking transformation. The substrate 100 is then rinsed in glacial acetic acid for about 35 minutes to remove the second material 110. Finally, the substrate is rinsed in deionized water for about 10 minutes to complete the removal of the second material 110.

In another example, a dry etching process utilizing an $O_2$ plasma is performed to remove the second material 110. A $CO_2$ precursor gas is provided at a flow rate of about 400 sccm at sub-atmospheric pressure. The $CO_2$ is energized into a plasma with an RF power of about 100 W and a bias of about 60 W and the etching process proceeds for about 25 seconds. One example of a chamber which may be utilized to perform the etching processes described herein is the MESA™ etch chamber available from Applied Materials, Inc., Santa Clara, Calif. However, it is contemplated that other chambers from other manufacturers may also perform the processes described herein.

Figure 3:
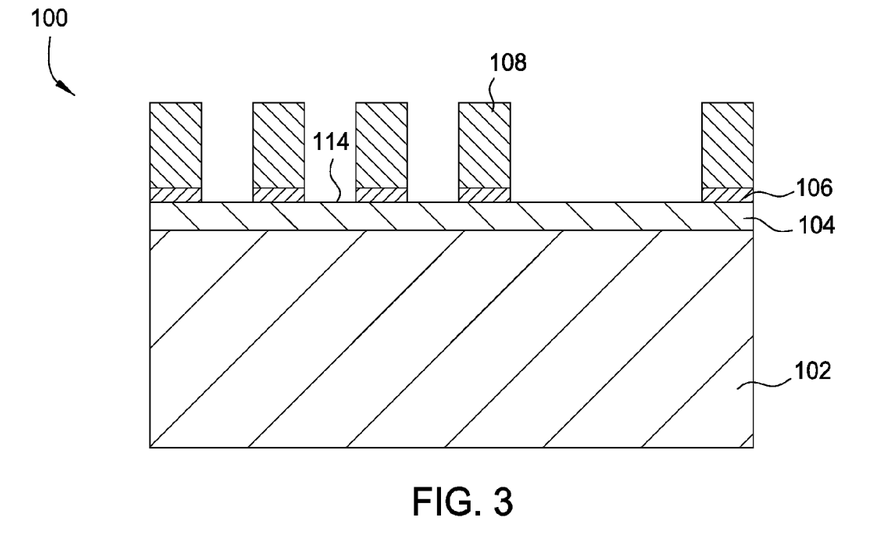
FIG. 3 is a cross-sectional view of the substrate illustrating the result of a neutral layer removal process.

FIG. 3 is a cross-sectional view of the substrate 100 illustrating the result of a neutral layer 106 removal process. The exposed region 112 of the neutral layer 106 is etched to remove a portion of the neutral layer 106. The removal of a portion of the neutral layer 106 creates an exposed region 114 of the hardmask layer 104, which may act as an etch stop in certain embodiments. In one example, the neutral layer 106 is etched utilizing a dry etch process. A $CF_4$ precursor gas is flowed at a rate of about 100 sccm in an environment having a pressure of about 15 mT. The CF$_4$ is energized into a plasma with an RF power of about 400 W and a bias of about 75 W and the etching process proceeds for about 35 seconds. As a result, the neutral layer 106 is removed to expose the hardmask layer 104.

Figure 4:
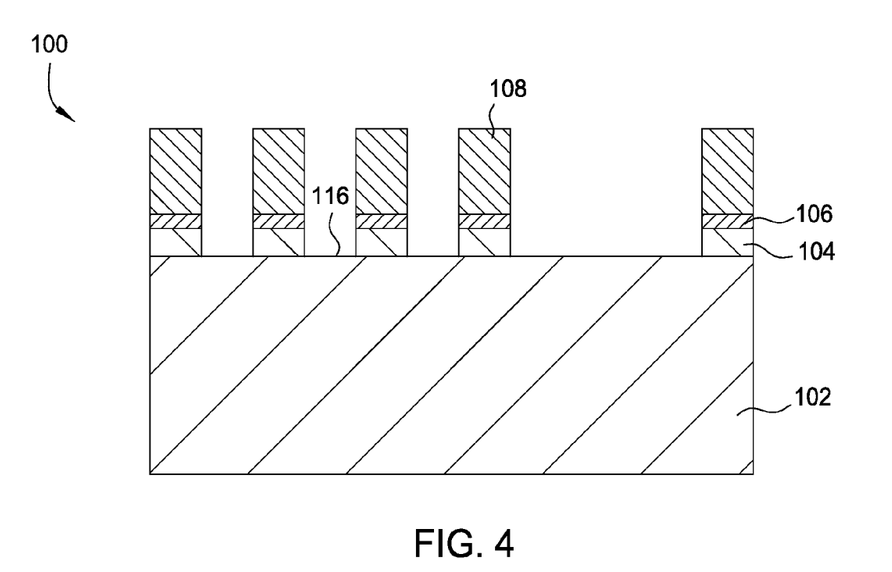
FIG. 4 is a cross-sectional view of the substrate illustrating the result of a hardmask layer etching process.

FIG. 4 is a cross-sectional view of the substrate 100 illustrating the result of a hardmask layer 104 etching process. The removal of a portion of the hardmask layer 104 creates an exposed region 116 of the silicon layer 102. In one example, the hardmask layer 104 is etched utilizing a dry etch process with a fluorine containing plasma. A CF$_4$ precursor gas and a CHF$_3$ precursor gas are flowed at a rate of about 100 sccm and 150 sccm, respectively, in an environment having a pressure of about 4 mT. The CF$_4$ and CHF$_3$ are energized into a plasma with an RF power of about 500 W and a bias of about 80 W and the etching process proceeds for about 40 seconds. As a result, the hardmask layer 104 is removed to expose the silicon layer 102.

Figure 5:
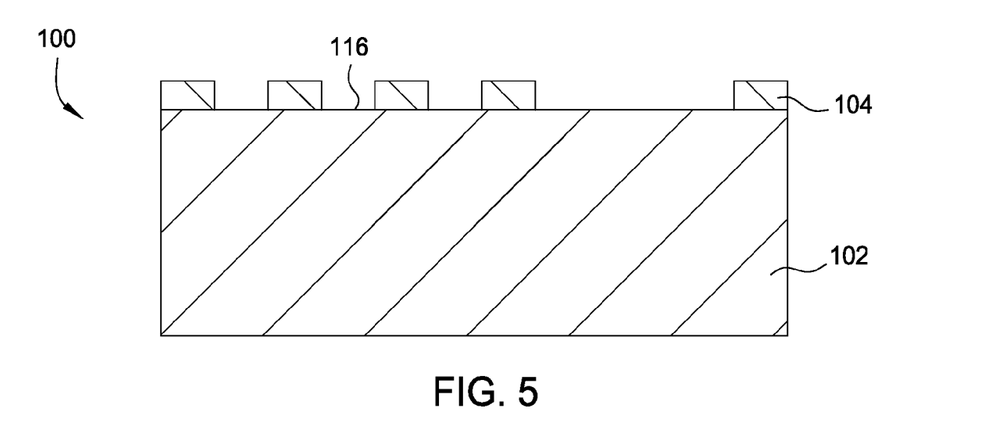
FIG. 5 is a cross-sectional view of the substrate illustrating the result of a photoresist and neutral layer stripping process.

FIG. 5 is a cross-sectional view of the substrate 100 illustrating the results of a photoresist and neutral layer stripping process. The first material 108 (not shown) and the neutral layer 106 (not shown) remaining under the first material 108 are etched to expose the hardmask layer 104. The first material 108 may be etched prior to etching the hardmask layer 104. In one example, the first material 108 and the neutral layer 106 are etched utilizing a dry etch process with an oxygen containing plasma. An O$_2$ precursor gas is flowed at a rate of about 150 sccm in an environment having a pressure of about 10 mT. The O$_2$ is energized into a plasma with an RF power of about 1000 W and a bias of about 50 W and the etching process proceeds for about 30 seconds. As a result, the first material 108 and the neutral layer 106 are removed to form a patterned hardmask layer 104 over the silicon layer 102.

Figure 6:
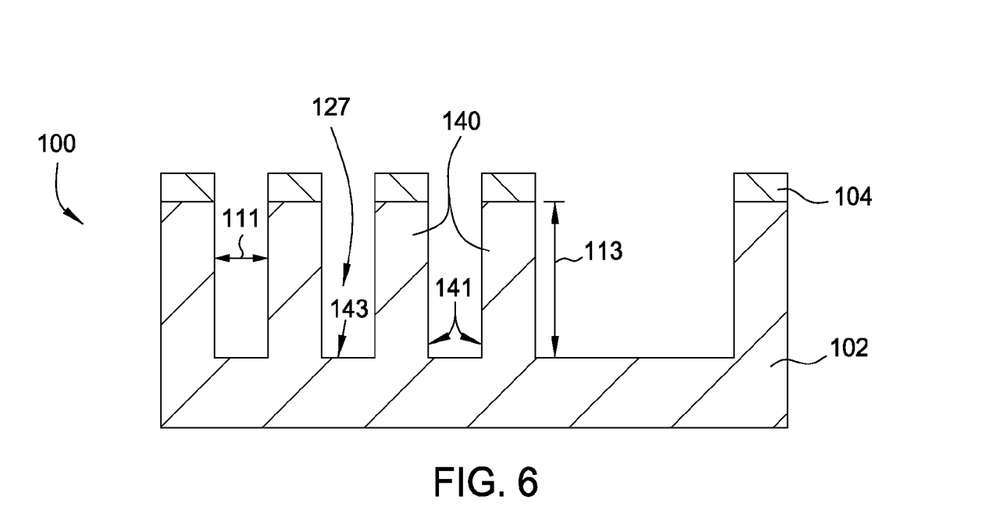
FIG. 6 is a cross-sectional view of the substrate illustrating the result of a silicon trench formation process.

FIG. 6 is a cross-sectional view of the substrate 100 illustrating the results of a silicon trench formation process. The exposed region 116 of the silicon layer 102 is etched to form a recess 127 in the silicon layer 102. The recess 127 formed in the silicon layer 102 defines mandrel structures 140 having sidewalls 141 and a bottom region 143 disposed between adjacent mandrel structures 140. Although depicted and described with regard to multiple mandrel structures 140, it is to be understood that a single recess 127 or mandrel structure 140 could be formed according to various embodiments described herein. The recess 127 has a depth 113 of between about 30 nm and about 400 nm, such as about 150 nm, and a width 111 of between about 10 nm and about 30 nm, such as about 20 nm. In one example, the silicon layer 102 is etched utilizing a dry etch process with a chlorine containing plasma. A Cl$_2$ precursor gas is flowed at a rate of about 500 sccm in an environment having a pressure of about 7 mT. The Cl$_2$ is energized into a plasma with an RF power of about 1000 W and a bias of about 700 W and the etching process proceeds for about 45 seconds. As a result, recesses 127 are formed in the silicon layer 102 which define mandrel structures 140.

Figure 7:
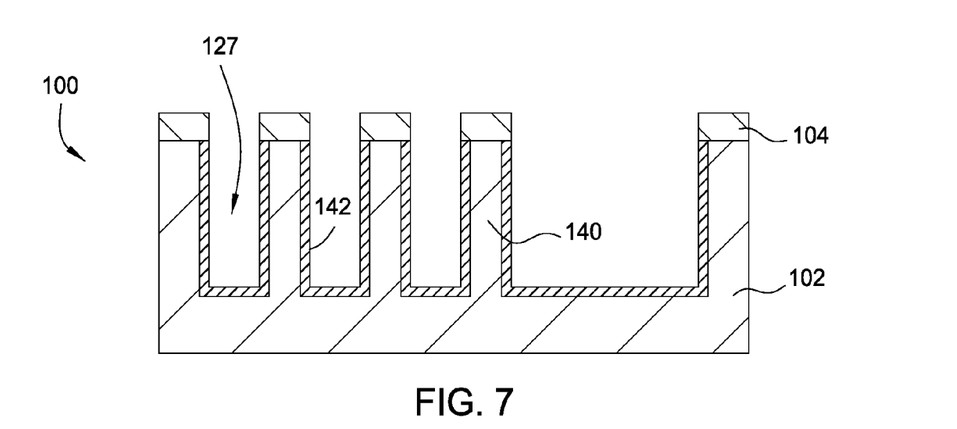
FIG. 7 is a cross-sectional view of the substrate illustrating the result of a mandrel structure surface oxidation process.

FIG. 7 is a cross-sectional view of the substrate 100 illustrating the result of a mandrel structure 140 surface oxidation process. The oxidation process oxidizes surfaces of the mandrel structures 140, such as the sidewalls 141 and the bottom region 143, to form an oxide layer 142. The oxide layer 142 incorporates silicon consumed from the mandrel structures 140 and also grows out from the surfaces of the mandrel structures 140 resulting in the substrate 100 having a silicon dioxide layer formed thereon. The mandrel structure 140 surface oxidation is performed by a thermal oxide process or a plasma induced oxidation process.

In one embodiment, the oxide layer 142 is formed in a batch furnace. A thermal oxide process in the furnace proceeds at a temperature of between about 800° C. and about 1200° C., such as about 1000° C. A pressure maintained in the furnace is between about 200 T and about 600 T, such as about 400 T. An oxygen containing precursor, such as water vapor or O$_2$, is provided to the furnace at a rate of between about 250 sccm and about 750 sccm, such as about 500 sccm. A nitrogen precursor for purging and native oxide prevention, such as N$_2$, is also provided to the furnace at a flow rate of between about 2000 sccm and about 3000 sccm, such as about 2500 sccm. The thermal oxide process within the furnace proceeds for a desired amount of time as a thickness of the oxide layer 142 is dependent upon the time of exposure within the oxygen environment. In one example, a 5 nm thick oxide layer 142 is formed for by performing the thermal oxide process for between about 120 seconds and about 240 seconds, such as about 180 seconds.

In another embodiment, the oxide layer 142 is formed in a single substrate chamber. A suitable chamber for performing a thermal oxide process is the VANTAGE® VULCAN™ RTP chamber available from Applied Materials, Inc., Santa Clara, Calif. The thermal oxide process in the chamber proceeds at a temperature of between about 950° C. and about 1050° C., such as about 1000° C. A pressure maintained in the chamber is between about 5 T and about 15 T, such as about 9 T. An oxygen containing precursor, such as O$_2$, is provided to the chamber at a rate of between about 15 slm and about 40 slm, such as about 27 slm. A hydrogen precursor, such as H$_2$, is also provided to the chamber at a flow rate of between about 0.5 slm and about 5 slm, such as about 3 slm. The thermal oxide process within the chamber proceeds for a desired amount of time as a thickness of the oxide layer 142 is dependent upon the time of exposure within the oxygen environment. In one example, a 5 nm thick oxide layer 142 is formed for by performing the thermal oxide process for between about 5 seconds and about 60 seconds, such as about 25 seconds.

In yet another embodiment, the oxide layer 142 is formed in a plasma chamber. A suitable chamber for performing a plasma induced oxidation process is the CENTURA® DPO (Decoupled Plasma Oxidation) chamber available from Applied Materials, Inc., Santa Clara, Calif. The plasma induced oxidation process in the chamber proceeds at a temperature of between about 5° C. and about 50° C., such as about 25° C. A rapid thermal process may also be utilized to raise a temperature of the substrate 100 to a temperature of about 600° C. A pressure maintained in the chamber is between about 5 mT and about 20 mT, such as about 10 mT. An oxygen containing precursor, such as O$_2$, is provided to the chamber at a rate of between about 10 sccm and about 100 sccm, such as about 40 sccm. A hydrogen precursor, such as H$_2$, is also provided to the chamber at a flow rate of between about 1.0 sccm and about 90 sccm, such as about 60 sccm. The precursor gases are energized into a plasma with an RF power of between about 500 W and about 5000 W, such as about 2000 W and a bias of between about 1 W and about 400 W, such as about 50 W. The thermal oxide process within the chamber proceeds for a desired amount of time as a thickness of the oxide layer 142 is dependent upon the time of exposure within the oxygen environment. In one example, a 5 nm thick oxide layer 142 is formed by performing the plasma induced oxidation process for between about 60 seconds and about 120 seconds, such as about 90 seconds.

Figure 8:
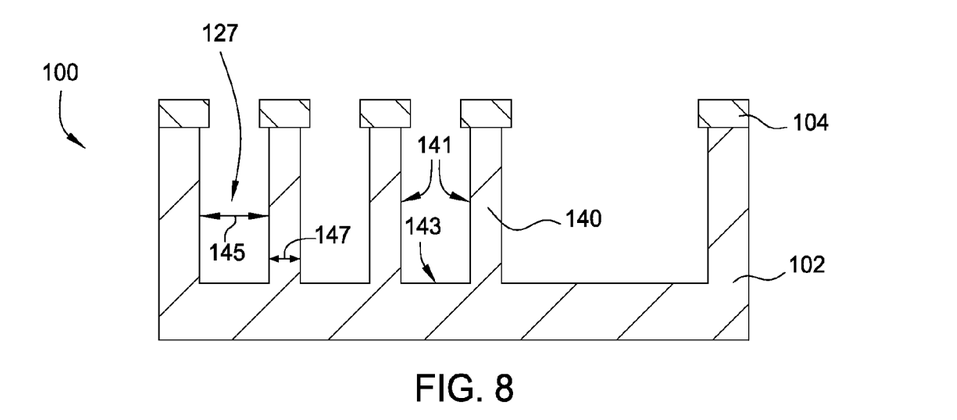
FIG. 8 is a cross-sectional view of the substrate illustrating the result of an oxide etch process.

FIG. 8 is a cross-sectional view of the substrate 100 illustrating the result of an oxide etch process. The oxide layer 142 formed on the mandrel structures 140 sidewalls 141 is etched to reduce a width 147 of the mandrel structures 140 and increase a width 145 of the recesses 127. The mandrel structures 140 are etched to reduce the width 147 of the mandrel structures 140 below about 10 nm, such as between about 5 nm and about 8 nm. Etching the oxide layer 142 on the bottom region 143 increases the depth of the recesses 127 formed into the silicon layer 102. The oxide etch process may be performed by either wet or dry etching methods.

In one embodiment, the oxide etch process is a wet etch process utilizing a buffered etch process selective for silicon. For example, the substrate 100 is immersed in an HF solution to remove the oxide layer 142. The oxide etch process proceeds for a predetermined duration to remove a desired amount of the oxide layer. A 100:1 HF solution has an etch rate for silicon dioxide of about 2.5 nm/min at room temperature. In one example, a 5 nm thick oxide layer 142 is removed by etching the oxide layer 142 for between about 90 seconds and about 150 seconds, such as about 120 seconds. The oxide etch process may be performed such that substantially all of the oxide layer 142 is removed in a single oxide etch process or the silicon mandrel oxidation and oxide etch processes may be repeated multiple times until a desired width 147 of the mandrel structures 140 is achieved.

Figure 9:
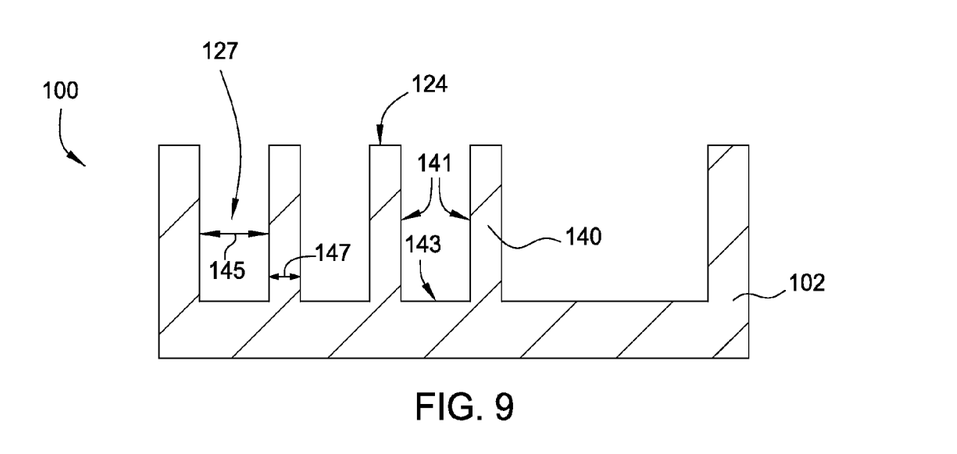
FIG. 9 is a cross-sectional view of the substrate illustrating the result of a hardmask layer removal process.

FIG. 9 is a cross-sectional view of the substrate 100 illustrating the result of a hardmask layer 104 removal process according to one embodiment. The hardmask layer 104 is removed after the oxide etch process to expose the mandrel structures 140. The hardmask layer 104 removal process may be performed by wet or dry etching processes similar to the examples provided with regard to FIG. 4. In an alternative embodiment described with regard to FIGS. 10B, 11B, 12B and 12C, the harmask layer 104 is maintained on the substrate 100 until after an ion implantation process has been performed.

Figure 10A:
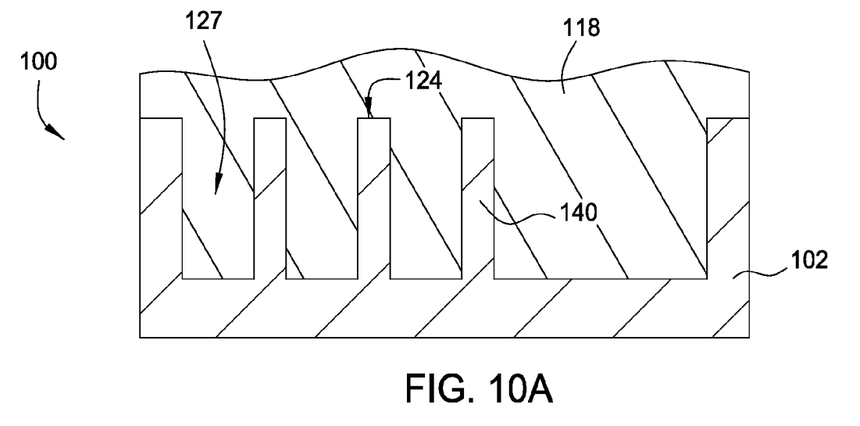
FIG. 10A is a cross-sectional view of the substrate illustrating the result of an insulator formation process.
Figure 10B:
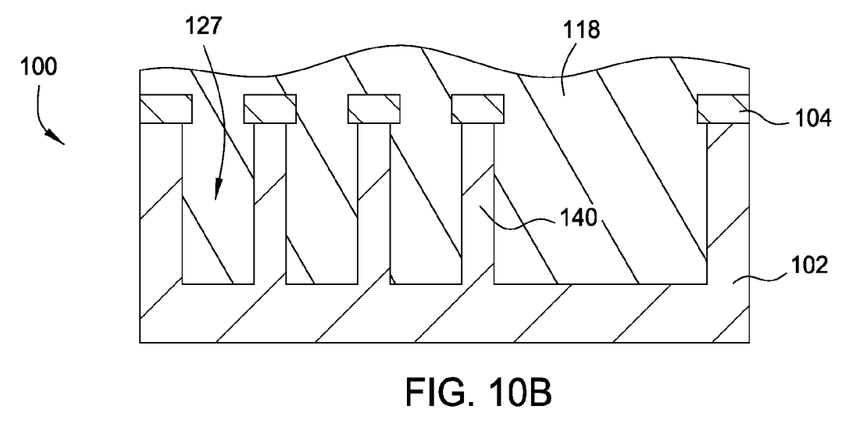
FIG. 10B is a cross-sectional view of the substrate illustrating an insulator formation process with a hardmask layer remaining on the mandrel structures.

FIG. 10A is a cross-sectional view of the substrate 100 illustrating the result of an insulator formation process. After the previously described mandrel structures 140 oxidation and oxide layer 142 etching processes are performed, an insulator layer 118 is deposited on the substrate 100. In one embodiment, the insulator layer 118 may be an oxide material. The insulator layer 118 is formed over the silicon layer 102 and the hardmask 104 by a flowable or a flow-like CVD process. The insulator layer 118 is typically formed in a blanket fashion, filling the recesses 127 of the silicon layer 102 and covering the mandrel structures 140. FIG. 10B depicts an alternative embodiment of the insulator formation process with the hardmask layer 104 remaining on the mandrel structures 140.

In one example of a flowable CVD process, such as the ETERNA™ Flowable CVD process available from Applied Materials, Inc., Santa Clara, Calif., an organosilicon precursor and an oxygen precursor at a temperature of about 100° C. or less may be provided to form a flowable oxide layer. Suitable organosilicon precursors have a ratio of carbon atoms to silicon atoms less than 8. Suitable organosilicon compounds may also have a ratio of oxygen to silicon atoms of 0 to about 6, and may include a Si—O—Si linkage that facilitates formation of $SiO_x$ films with reduced contamination from carbon and hydroxyl groups. Suitable oxygen precursors may include molecular oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors.

A carrier gas, for example, an inert gas, may also be provided with the organosilicon and oxygen precursors. The oxygen precursor may be activated prior to introduction to the chamber, for example using a remote plasma generator, which may include thermal dissociation, ultraviolet light dissociation, RF, DC, and/or microwave dissociation. In one embodiment, 4-6 kW of RF power may be coupled into a flow of 900-1,800 sccm of argon and 600-1,200 sccm of molecular oxygen. The organosilicon precursor may be provided to the chamber separately from the oxygen precursor to prevent reactions outside the chamber. The organosilicon precursor may be introduced as a gas to the chamber at a liquid-equivalent flow rate of about 800 mgm to about 1,600 mgm. Helium may be included as a carrier gas at a flow rate of about 600 sccm to about 2,400 sccm. An activated oxygen precursor may be introduced to the chamber at a flow rate between about 3 slm and about 20 slm.

The precursors react to deposit a flowable oxide layer, or insulator layer 118, on the substrate 100. The CVD process described above may be implemented on the PRODUCER® CVD system available from Applied Materials, Inc., of Santa Clara, Calif. However, it is contemplated that other chambers from other manufacturers may also perform the processes described.

Figure 11A:
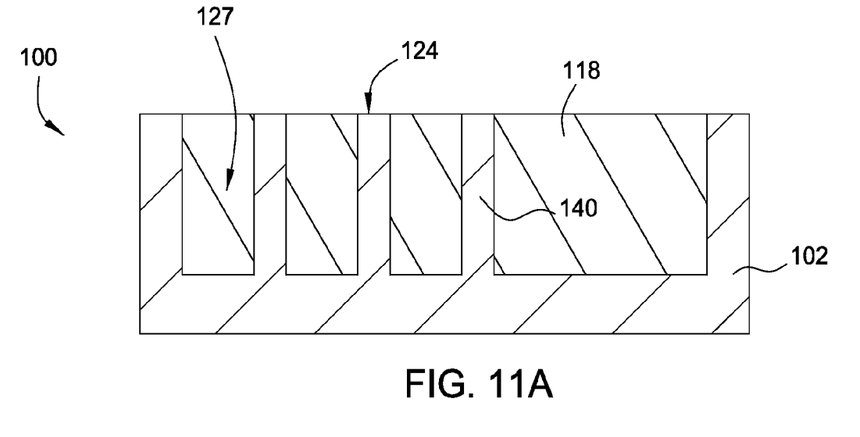
FIG. 11A is a cross-sectional view of the substrate illustrating the result of an insulator layer chemical mechanical polishing/planarization (CMP) process.
Figure 11B:
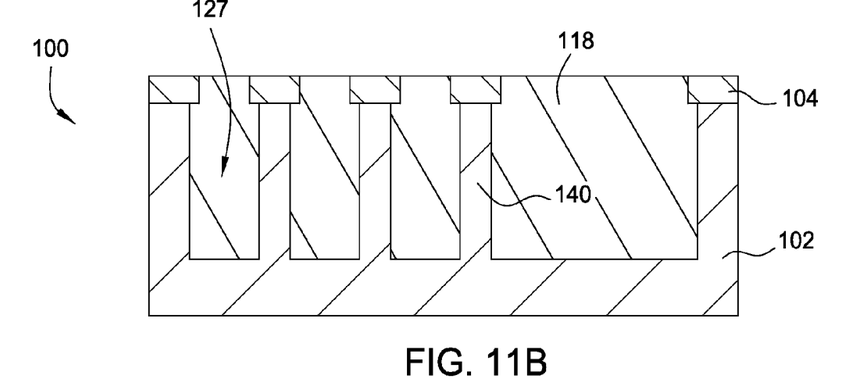
FIG. 11B is a cross-sectional view of the substrate illustrating the result of the CMP process with the hardmask layer remaining on the mandrel structures.

FIG. 11A is a cross-sectional view of the substrate 100 illustrating the result of an insulator layer 118 chemical mechanical polishing/planarization (CMP) process according to one embodiment. The previously deposited insulator layer 118 may have a non-uniform thickness as deposited across the surface of the substrate 100. A CMP process is utilized to planarize the top surface 126 of the substrate 100. The CMP process is performed to polish the top surface 126 of the substrate 100 such that the insulator layer 118 is substantially co-planar with a top surface 124 of the mandrel structures 140. In this embodiment, the mandrel structures 140 may be utilized as a hard stop for the CMP process to determine a polishing end point. The CMP process may be implemented on the REFLEXION GT™ system or other similar systems available from Applied Materials, Inc., Santa Clara, Calif. However, it is contemplated that other CMP systems from other manufacturers may also perform the processes described. FIG. 11B depicts the result of an alternative embodiment of the CMP process with the hardmask layer 104 remaining on the mandrel structures 140. In this embodiment, the hardmask layer 104 may be utilized as a hard stop for the CMP process to determine a polishing end point.

Figure 12A:
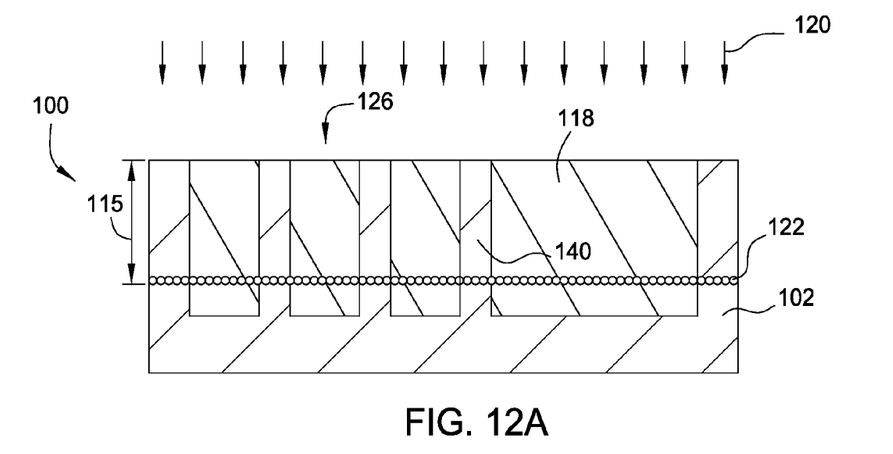
FIG. 12A is a cross-sectional view of the substrate illustrating the result of an ion implantation process.
Figure 12B:
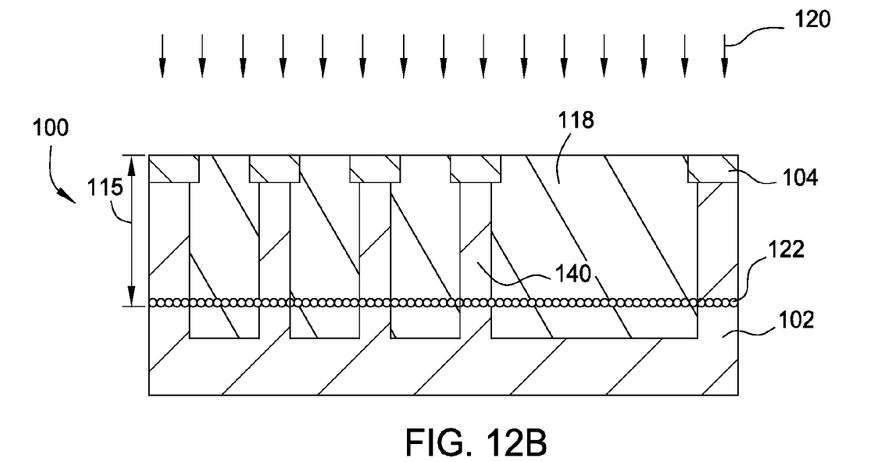
FIG. 12B is a cross-sectional view of the substrate illustrating a result of the ion implantation process with the hardmask layer remaining on the mandrel structures.

FIG. 12A is a cross-sectional view of the substrate 100 illustrating the result of an ion implantation process 120 according to one embodiment. A suitable chamber for performing the ion implantation is the Varian VIISTA® Trident system, available from Applied Materials, Inc., Santa Clara, Calif. The ion implantation process 120 is utilized to implant an n-type dopant, such as antimony, arsenic, or phosphorous, a desired depth into the substrate 100 to form an implanted region 122. A low dose of n-type dopant is implanted to a depth 115 of between about 30 nm and about 400 nm from the top surface 126 of the substrate. For example, arsenic implanted at an energy of 50 keV can achieve a depth 115 of about 100 nm. The depth 115 of the ions implanted into the substrate 100 and the corresponding implanted region 122 may correlate to an etch stop of a subsequent mandrel structures 140 etch process described in detail with regard to FIG. 13. FIG. 12B depicts an alternative embodiment of the ion implantation process 120 with the hardmask layer 104 remaining on the mandrel structures 140. In this embodiment, the depth 115 may be greater than the depth 115 described with regard to FIG. 12A by an amount equal to the thickness 109 of the hardmask layer 104.

Figure 12C:
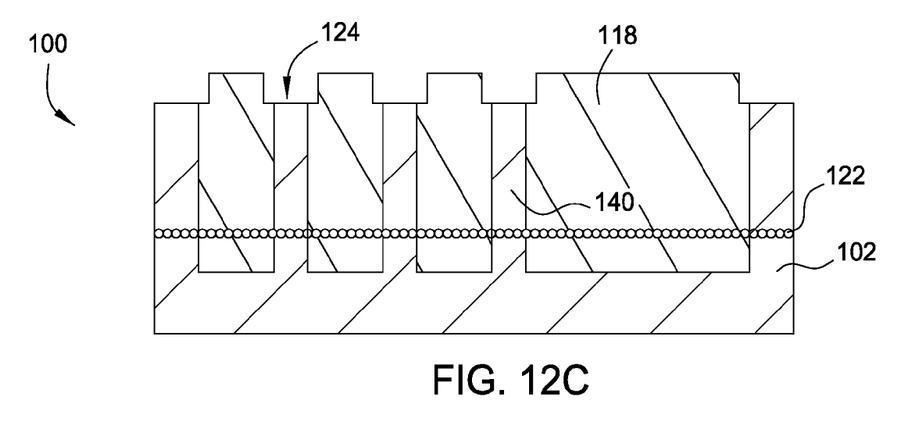
FIG. 12C is a cross-sectional view of the substrate illustrating the result of a hardmask layer removal process subsequent to the process illustrated in FIG. 12B.

FIG. 12C is a cross-sectional view of the substrate 100 illustrating the result of a hardmask layer 104 removal process subsequent to the process illustrated in FIG. 12B. The hardmask layer 104 is removed after the ion implantation process 120 to expose the top surface of the mandrel structures 140. The hardmask layer 104 removal process may be performed by wet or dry etching processes similar to the examples provided with regard to FIG. 4. After the removal of the hardmask layer 104, the insulator layer 118 may extend beyond the top surface 124 of the mandrel structures 140.

Figure 12D:
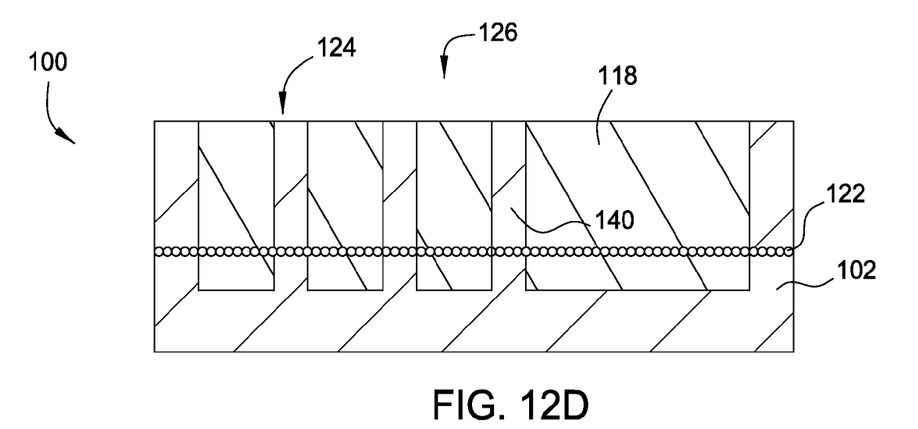
FIG. 12D is a cross-sectional view of the substrate illustrating the result of an insulating layer recess etching process performed subsequent to the hardmask layer removal process illustrated in FIG. 12C.

FIG. 12D is a cross-sectional view of the substrate 100 illustrating the result of an insulating layer 118 recess etching process performed subsequent to the hardmask layer 104 removal process illustrated in FIG. 12C. Portions of the insulator layer 118 extending beyond the top surface 124 of the mandrel structures 140 are removed by an etching process to form the substantially planar top surface 126. The etching process may be either a wet etch or dry etch. In one example, the insulator layer 118 is etched utilizing a dry etch process with a fluorine containing plasma. A $CF_4$ precursor gas is flowed at a rate of about 100 sccm in an environment having a pressure of about 5 mT. The $CF_4$ is energized into a plasma with an RF power of about 500 W and a bias of about 500 W and the etching process proceeds for about 45 seconds. As a result, the insulator layer 118 is etched to a height such that the insulator layer 118 and the mandrel structures 140 are substantially co-planar. Thus, the top surface 126 of the substrate 100 is planarized.

Figure 13:
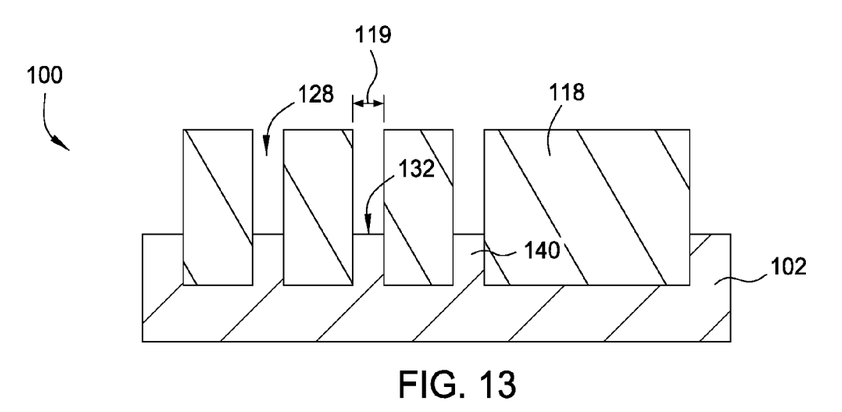
FIG. 13 is a cross-sectional view of the substrate illustrating the result of a mandrel structure etching process.

FIG. 13 is a cross-sectional view of the substrate 100 illustrating the result of a mandrel structure 140 etching process. The mandrel structures 140 are etched to form a trench 128 bounded by the insulator layer 118. In one example, the mandrel structures 140 are etched utilizing a dry etch process with a chlorine containing plasma. A $Cl_2$ precursor gas is flowed at a rate of about 500 sccm in an environment having a pressure of about 7 mT. The $Cl_2$ is energized into a plasma with an RF power of about 1000 W and a bias of about 700 W and the etching process proceeds for about 45 seconds. The mandrel structures 140 may be etched to a depth which corresponds to the implanted region 122. The resulting trench 128 has a bottom comprising a regrowth region 132 of the mandrel structures 140 and sidewalls comprising the insulator layer 118. Dimensions of the trench 128 are such that a width 119 of the trench 128 is less than about 10 nm, such as between about 5 nm and about 8 nm.

Figure 14:
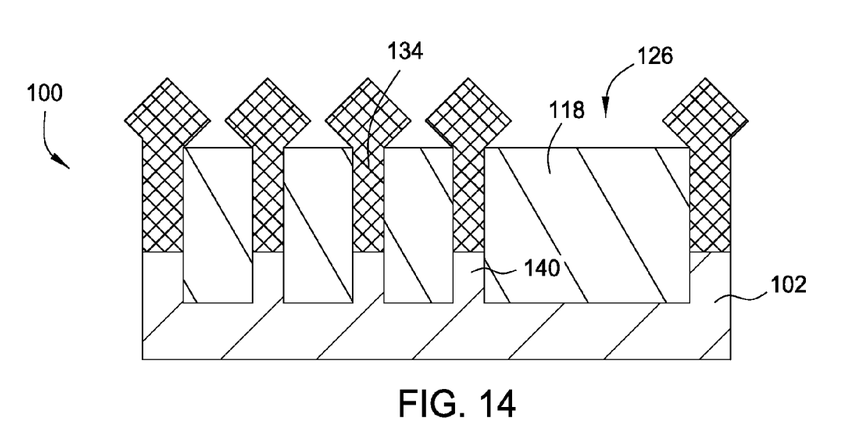
FIG. 14 is a cross-sectional view of the substrate illustrating the result of a fin structure formation process.

FIG. 14 is a cross-sectional view of the substrate 100 illustrating the result of a fin structure 134 formation process. A semiconducting material, such as silicon, germanium, silicon germanium, compound semiconductor materials and various other III-V materials, is deposited on the regrowth region 132 to form the fin structure 134. The fin structure 134 is grown epitaxially from the regrowth region 132 away from the mandrel structures 140. The material may be grown beyond the top surface 126 of the substrate 100. The fin structure 134 is bounded by the insulator layer 118 from the regrowth region 132 to the top surface 126 of the substrate 100.

Figure 15:
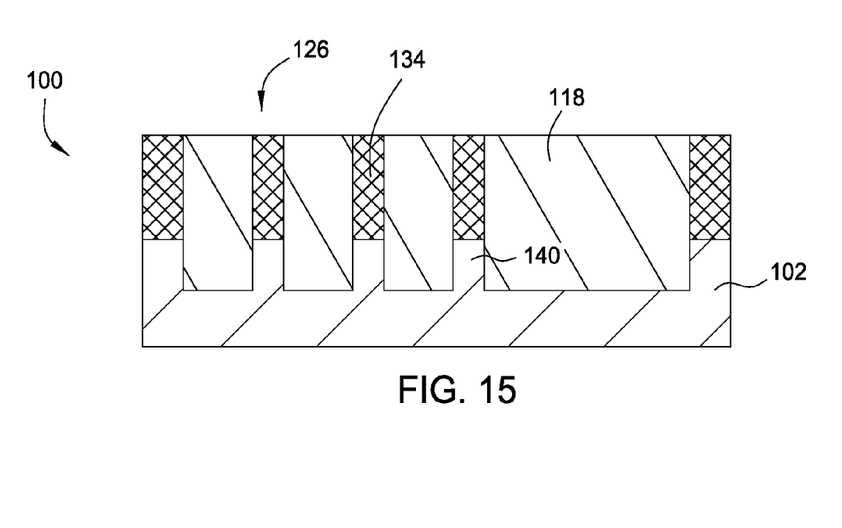
FIG. 15 is a cross-sectional view of the substrate illustrating the result of a substrate planarization process.

FIG. 15 is a cross-sectional view of the substrate 100 illustrating the result of the substrate 100 planarization process. A CMP process is performed to remove the excess semiconductive material of the fin structure 134. The fin structure 134 is planarized such that the fin structure 134 is substantially co-planar at the top surface 126 with the insulator material 118. The resulting substrate 100 comprises the fin structure 134 bounded by the insulator material 118.

The fin structure 134 has a width 119 of less than 10 nm, for example, between about 5 nm and about 8 nm, and an aspect ratio of the fin structure 134 is between about 5:1 and about 30:1. The fin structure 134 may be part of a FinFET structure formed on the substrate 100. The above methods provide for formation of a trench with a semiconducting fin formed therein with critical dimensions less than 10 nm.

In one embodiment, the methods described above are performed in sequence, however, it is contemplated that other processing steps may be utilized or that the processing steps may be performed in any order to achieve the resulting FinFET structure.

Figure 16:
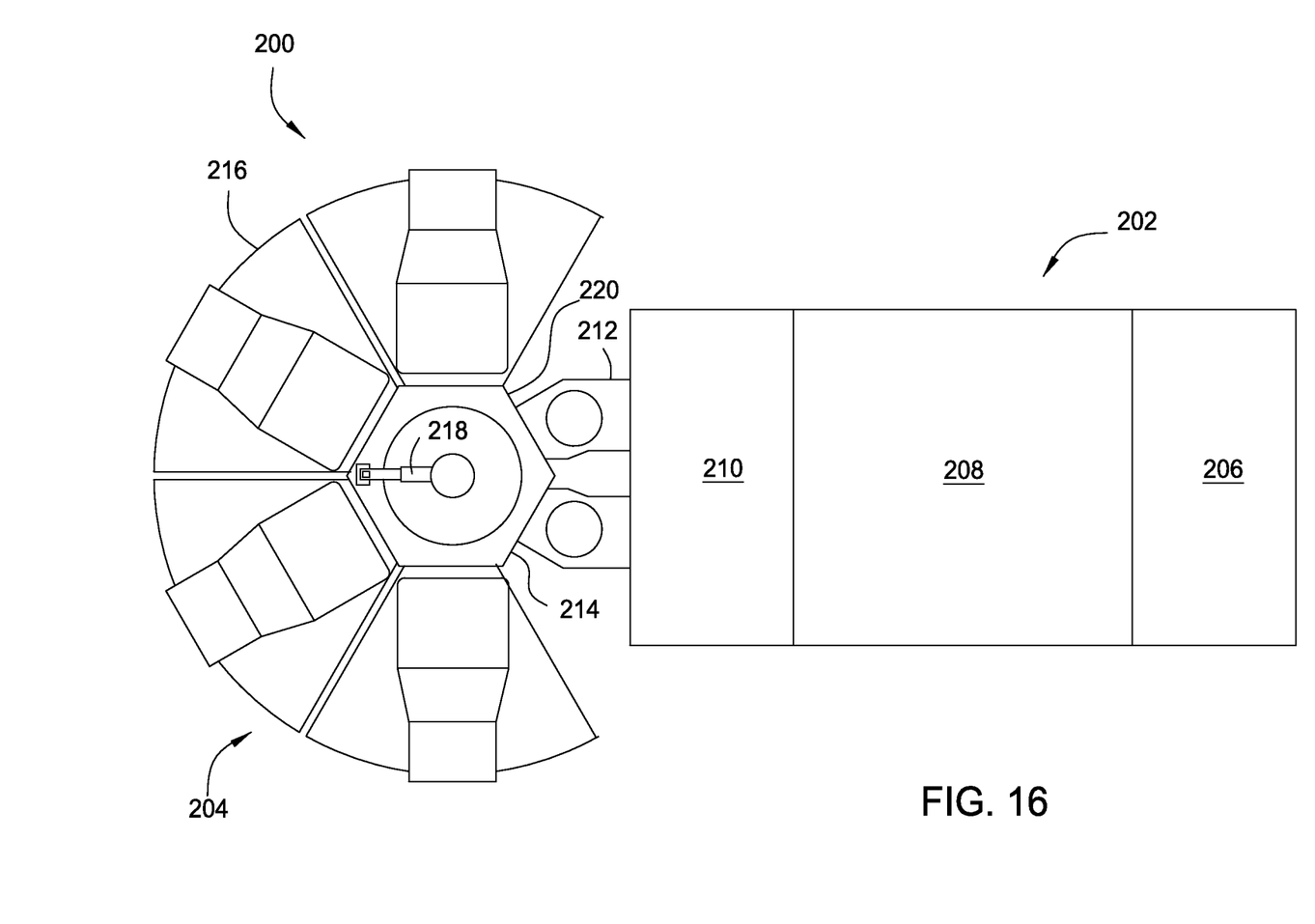
FIG. 16 illustrates a schematic plan view of an apparatus which may be used to perform various processes described herein.

FIG. 16 is a schematic plan view of an apparatus 200 that may be utilized to perform the various processes described herein. The apparatus 200 comprises a substrate handling portion 202 and a substrate processing portion 204. The substrate handling portion 202 comprises a loading station 206, a transfer station 208, and an interface station 210. Substrates are loaded into the apparatus 200 at the loading station 206. In some cases, the loading operation may comprise disposing one or more substrates on a carrier for transport through the apparatus 200. The transfer station 208 moves substrates from the loading station 206 to the interface station 210. The transfer station 208 may comprise substrate handling features, such as flippers, if desired. The interface station 208 provides substrates to an entry load-lock chamber 212 for entry to the substrate processing portion 204, which generally operates under vacuum.

The substrate processing portion 204 comprises a plurality of substrate processing chambers 216 coupled to a transfer chamber 220 with a transfer robot 218 disposed therein. Each of the processing chambers 516 may be an ALD chamber, a low temperature CVD chamber, a high-density plasma CVD chamber, a PECVD chamber, an etch chamber, a cure chamber, a plasma cleaning chamber, an oxide furnace, a thermal oxide chamber or an ion implantation chamber. In one embodiment, the chambers 516 include a plasma CVD chamber that forms a hardmask layer and/or a flowable oxide layer, and a plasma etch chamber that can etch silicon layers and oxide layers. The plasma CVD chamber may be an HDP CVD chamber, and the plasma etch chamber may be a remote plasma chamber with fluorine and oxygen precursors coupled thereto for oxide and silicon etching. An exit load-lock chamber 214 receives processed substrates for transfer back to the substrate handling portion 202.

In embodiments featuring a plurality of substrates disposed on a substrate carrier for processing, each of the processing chambers 216 may process a plurality of substrates at the same time. When the apparatus 200 is used to practice the methods described above, any or all of processes may be performed on a plurality of substrates simultaneously.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a fin structure on a substrate, comprising:
    etching a silicon layer to form a trench defining a silicon mandrel structure;
    oxidizing sidewalls of the silicon mandrel structure and a bottom surface of the trench to form an oxidized surface which incorporates silicon consumed from the silicon mandrel structure;
    etching the oxidized surface to reduce a width of the silicon mandrel structure;
    depositing an insulator material over the silicon layer after the etching the oxidized surface;
    implanting ions into the silicon mandrel structure and the insulator material to form an implanted region which correlates to an etch stop;

etching the silicon mandrel structure to the implanted region;

forming a semiconducting material on the silicon mandrel structure, the semiconducting material bounded by the insulator material; and planarizing a portion of the insulator material and the semiconducting material.

2. The method of claim 1, further comprising etching a first region of a photoresist layer to expose a first region of a neutral layer.

3. The method of claim 2, further comprising etching the exposed region of the neutral layer to expose a first region of a hardmask layer.

4. The method of claim 3, further comprising etching the exposed region of the hardmask layer to expose a first region of the silicon layer.

5. The method of claim 4, further comprising etching a second region of the photoresist layer and a second region of the neutral layer to expose a second region of the hardmask layer.

6. The method of claim 5, further comprising planarizing the second region of the hardmask layer and the insulator material.

7. The method of claim 5, further comprising etching the second region of the hardmask layer to expose the silicon mandrel structure.

8. The method of claim 1, wherein the etching the oxidized surface consumes between about 2 nm and about 5 nm of the silicon mandrel structure.

9. The method of claim 1, wherein the forming an oxidized surface and the etching the oxidized surface are repeated until the silicon mandrel structure has a width less than about 10 nm.

10. The method of claim 1, wherein the semiconducting material has a critical dimension of less than about 10 nm.

11. The method of claim 10, wherein the semiconducting material comprises SiGe, Ge, and other compound semiconductor materials.

12. A method of forming a fin structure on a substrate, comprising:

etching a silicon layer to form a trench defining a silicon mandrel structure;

oxidizing sidewalls of the silicon mandrel structure and a bottom surface of the trench to form an oxidized surface which incorporates silicon consumed from the silicon mandrel structure, the oxidized surface comprising silicon dioxide having a thickness of between about 2 nm and about 5 nm;

etching the silicon dioxide to reduce a width of the silicon mandrel structure to between about 5 nm and about 8 nm;

depositing an oxide material over the silicon layer after the etching the oxidized surface;

implanting ions into the silicon mandrel structure and the oxide material to form an implanted region which correlates to an etch stop;

etching the silicon mandrel structure to the implanted region;

forming a semiconducting material on the silicon mandrel structure, the semiconducting material bounded by the oxide material; and planarizing a portion of the oxide material and the semiconducting material.

13. The method of claim 12, wherein the oxidized surface is formed by a thermal oxide process.

14. The method of claim 12, wherein the oxidized surface is formed by an oxygen plasma induced process.

15. The method of claim 12, wherein the forming an oxidized surface and the etching the oxidized surface are repeated until the silicon mandrel structure has a width between about 5 nm and about 8 nm.

16. A method of forming a fin structure on a substrate, comprising:

depositing one or more photoresist materials;

annealing the one or more photoresist materials to form a first region of a photoresist layer and a second region of a photoresist layer;

etching the first region of a photoresist layer to expose a first region of a neutral layer;

etching the exposed region of the neutral layer to expose a first region of a hardmask layer;

etching the exposed region of the hardmask layer to expose a silicon layer;

etching the second region of the photoresist layer and a second region of the neutral layer to expose a second region of the hardmask layer;

etching the silicon layer to form a trench defining a silicon mandrel structure;

oxidizing sidewalls of the silicon mandrel structure and a bottom surface of the trench to form an oxidized surface which incorporates silicon consumed from the silicon mandrel structure;

etching the oxidized surface to reduce a width of the silicon mandrel structure;

removing the second region of the hardmask layer;

depositing an insulator material over the silicon layer after the etching the oxidized surface;

planarizing a top surface of the silicon mandrel structure and the insulator material;

implanting ions into the silicon mandrel structure and the insulator material;

etching the silicon mandrel structure to a depth of the implanted ions to expose insulator features;

depositing a semiconducting material on a regrowth region of the silicon mandrel structure to form a fin structure, wherein the fin structure is bounded by the insulator material; and removing a portion of the insulator material and the fin structure to form a planar surface.

17. The method of claim 14 wherein the fin structure has an aspect ratio between about 5:1 and about 30:1.

18. The method of claim 17, wherein the fin structure has a critical dimension of less than about 10 nm.

19. The method of claim 16, wherein the removing the second region of the hardmask layer is performed after the ions are implanted into the silicon mandrel structure and the insulator material.

* * * * *